United States Patent [19]

Kunkle et al.

[11] Patent Number: 4,682,829

[45] Date of Patent: Jul. 28, 1987

[54] SURFACE MOUNT SOCKET FOR DUAL IN-LINE PACKAGE

[75] Inventors: John P. Kunkle, Clemmons; Donald W. McClune, Winston-Salem, both of N.C.

[73] Assignee: AMP Incorporated, Harrisburg, Pa.

[21] Appl. No.: 744,180

[22] Filed: Jun. 13, 1985

[51] Int. Cl.[4] .......................................... H01R 23/72
[52] U.S. Cl. .................................. 439/83; 29/840; 361/408; 439/70
[58] Field of Search ............. 339/17 C, 17 D, 17 CF, 339/17 L, 17 LM, 17 M, 176 MP, 275 B; 361/405, 408; 29/840, 843; 174/52 FP; 228/180.1, 180.2

[56] References Cited

U.S. PATENT DOCUMENTS

| | | | |
|---|---|---|---|
| 3,696,323 | 10/1972 | Kinkaid et al. | 339/17 CF |
| 3,984,166 | 10/1976 | Hutchison | 339/17 CF |
| 4,035,046 | 7/1977 | Kloth | 339/17 CF |
| 4,089,575 | 5/1978 | Grabbe | 339/17 CF |
| 4,139,881 | 2/1979 | Shimizu et al. | 228/180.1 |
| 4,272,140 | 6/1981 | Lychyk et al. | 339/17 CF |
| 4,341,433 | 7/1982 | Cherian et al. | 339/17 CF |
| 4,550,959 | 11/1985 | Grabbe et al. | 339/17 LM |
| 4,555,153 | 11/1985 | Bricaud et al. | 339/17 CF |

FOREIGN PATENT DOCUMENTS 57-181144  11/1982  Japan ........................ 339/17 CF

*Primary Examiner*—Neil Abrams
*Attorney, Agent, or Firm*—Robert W. Pitts; Anthony P. Ness

[57] ABSTRACT

A surface mounting socket suitable for use with dual in-line circuit packages and printed circuit boards adapted only for surface mounting is disclosed. The socket has a plurality of terminals each having perpendicular sections which form a compliant termination to a surface mounting pad on the printed circuit board. Each terminal is compliant about a longitudinal force along two orthogonal axes and is compliant in response to a torsional moment about a third orthogonal axis.

6 Claims, 7 Drawing Figures

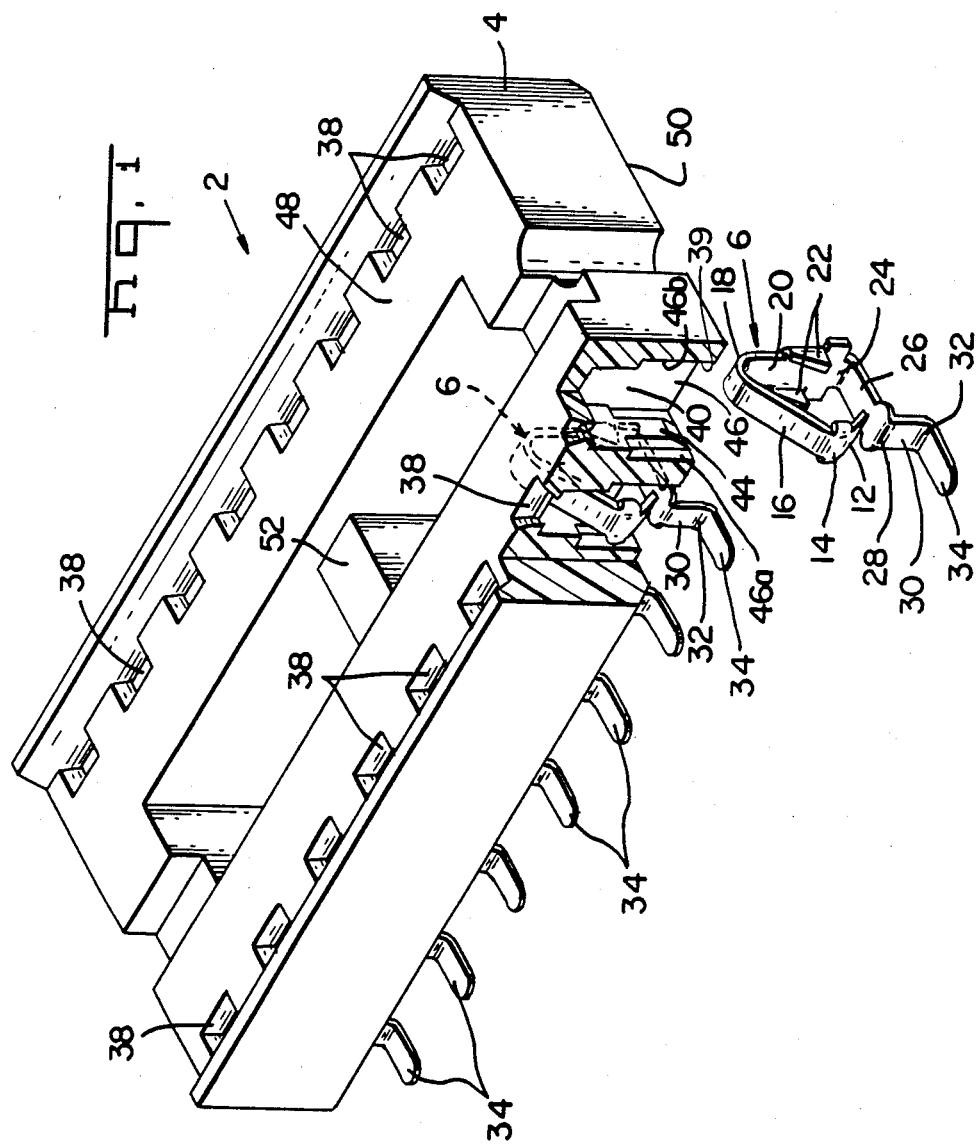

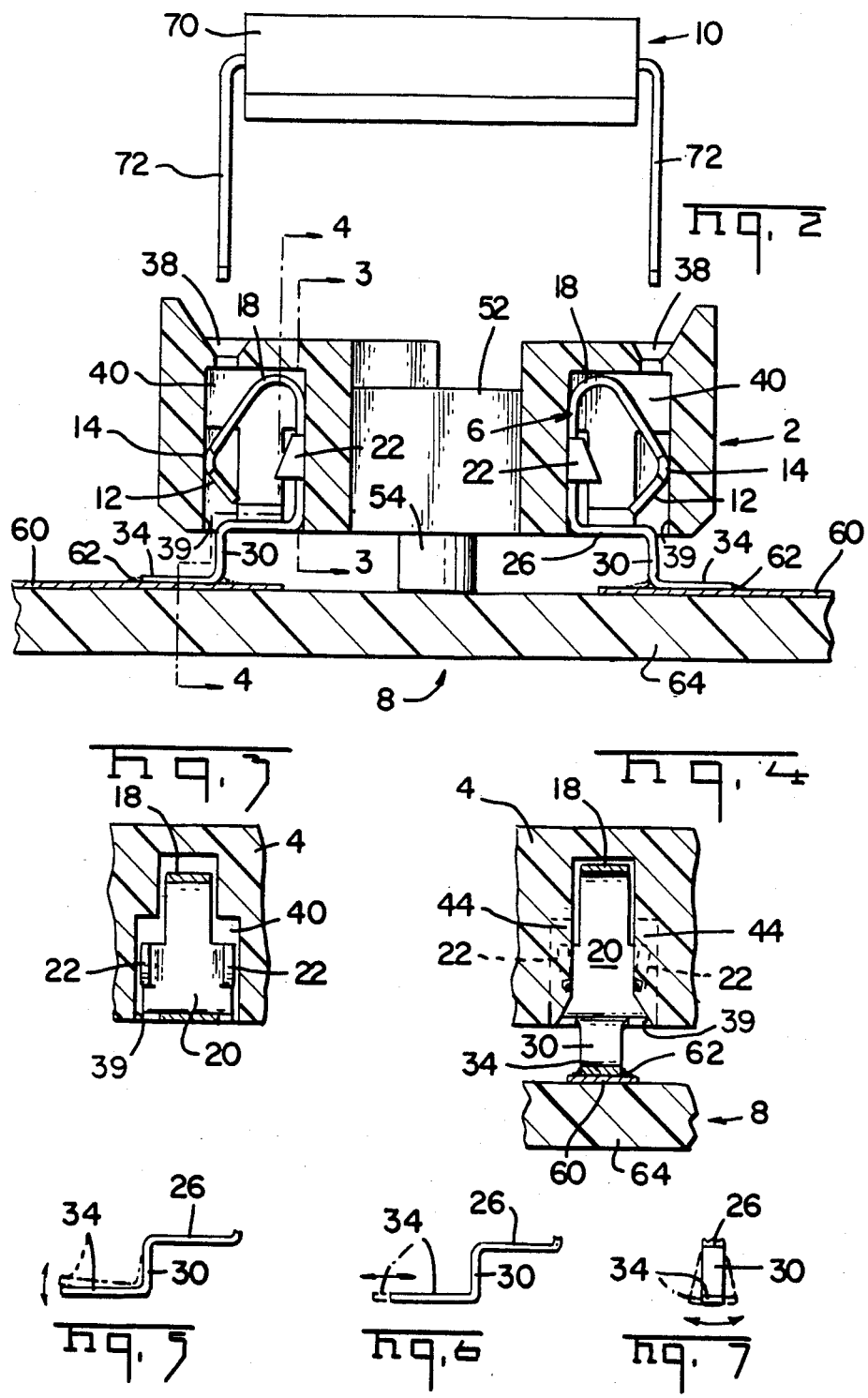

SURFACE MOUNT SOCKET FOR DUAL IN-LINE PACKAGE

BACKGROUND OF THE INVENTION

1. Field of the Invention

This invention relates to a socket for mounting electrical components on a printed circuit board and more particularly relates to a multicontact surface mount socket for mounting an integrated circuit package on a printed circuit board.

2. Description of the Prior Art

Socket assemblies adapted to receive electronic components or packages and which can be connected by leads through apertures in printed circuit boards to printed circuits by means of DIP soldering or wave soldering techniques are in wide use, especially for mounting components such as dual in-line packages which comprise components having leads extending from an encapsulated integrated chip package. For example a conventional dual in-line package comprises a plastic housing, in which an integrated circuit is insert molded and has a plurality of leads extending in parallel rows to opposite sides of the plastic package. Typical dual in-line packages might have 14 leads although other sizes are available.

Although dual in-line packages can be attached directly to printed circuit boards, having plated-through holes for receiving the leads, a common practice is to use a separate socket for establishing a mechanical connection to the leads of the dual in-line package. The separate socket has in turn a spring loaded portion for engaging the dual in-line package lead and an extending lead for receipt in a plated-through hole in a circuit board. One example of a dual in-line socket having a leaf spring arrangement received and soldered in a hole in a printed circuit board is shown in U.S. Pat. No. 3,696,323, wherein the leads are soldered directly to traces on the lower surface of the printed circuit board. Sockets of the type disclosed therein are employed because the DIP leads can be damaged during insertion in the printed circuit board or during the soldering operation. A further disadvantage of soldering a DIP directly to a printed circuit board is that soldered DIP packages are difficult to replace. Another conventional socket for use with DIP packages is disclosed in U.S. Pat. No. 4,060,296.

Although through-hole interconnection of DIP packages and sockets represents the conventional manner of interconnecting integrated sockets to a printed circuit board, increasing use is being made of surface mount techniques to interconnect integrated circuitry to mounting pads located directly on the surface of a printed circuit board. Surface mount techniques generally employ a predeposited solder paste located on surface mount pads, to which a component such as a chip carrier or a simple electrical component such as a resistor are attached. The component is first positioned in registry with the surface mounting pad and then the component is soldered directly to the surface mounting pad. Surface mount soldering operations include vapor phase reflow soldering and infrared heating, both widely accepted methods of surface mount soldering.

By attaching individual components and component receptacles directly to the surface of a printed circuit board, the amount of board real estate required to mount individual components is reduced, thus allowing greater density of the components on the board. Although surface mounting of components on printed circuit boards offers many advantages, a great many common electrical components, such as dual in-line packages which are employed in numerous systems are not amenable to direct surface mounting. In part, the difficulty in directly mounting the leads of a dual in-line package directly to surface mount pads on a printed circuit board is attributable to the stresses induced as a result of differing coefficients of thermal expansion between the printed circuit board and the dual in-line package. The forces generated as a result of thermal cycling thus would place significant stress upon the leads. Since a surface mount solder connection is inherently weaker than a through-hole connection, in part because of the amount of solder and surface area available for solder, these stresses can cause significant difficulty with surface mounted components. Thus the use of a conventional dual in-line package with other surface mount components on a printed circuit board would require two separate soldering operations, such as a vapor phase reflow soldering operation for attachment of surface mount components to the printed circuit board and the conventional wave soldering operation to attach the leads from a DIP package or a conventional DIP socket to conductors on the lower surface of the printed circuit board. Thus a user would not be able to simultaneously realize the advantages of surface mount technology while still employing conventional dual in-line package electronic components in its circuitry. The instant invention provides a means for surface mounting a dual in-line package to a printed circuit board to permit the user to realize the advantages of surface mount components while still employing conventional dual in-line packages which have proved to be satisfactory components of its electrical system.

SUMMARY OF THE INVENTION

A multicontact surface mount socket, for receipt of a dual in-line circuit element package having a plurality of external leads insertable into the socket forms a solder connection which is compliant in translation about two orthogonal axes and which is compliant in torsion about a third orthogonal axis. The socket forms a mechanical and electrical connection to surface mounting pads on a printed circuit board which have solder paste predeposited thereon. Each of the terminals has a cantilever section for establishing a mechanical connection to a single lead in the dual in-line package when inserted into cavities in the insulating socket housing. The cantilever section is located adjacent a first end of each terminal with the opposite end comprising a surface mount lap joint with the mounting pads on a printed circuit board. Each terminal is anchored in its respective housing cavity by barbs on one portion of the terminal. Two mutually perpendicular sections on each terminal extend between the barb and the solder leg which forms the lap joint on the surface mounting pads. One of these sections extends along the lower surface of the housing and is generally parallel to the printed circuit board. The other of these two sections extends perpendicular to the printed circuit board and perpendicular to the solder leg forming the lap connection. This perpendicular section is located laterally adjacent and beneath the cantilever section of the terminal. A pedestal located on the lower surface of the housing provides means for adhesively securing the socket to the printed circuit board prior to soldering the terminal legs to the surface mounting pads.

BRIEF DESCRIPTION OF THE DRAWINGS

FIG. 1 is an exploded perspective view of a surface mount socket showing individual terminals as received in cavities in the housing.

FIG. 2 is a sectional view of the socket showing terminals in two rows and showing the relative position between the socket and printed circuit board, with a dual in-line package shown in alignment with the terminal-receiving cavities in the housing prior to insertion in the socket.

FIG. 3 is a sectional view taken along section lines 3—3 of FIG. 2.

FIG. 4 is a sectional view taken along section lines 4—4 of FIG. 2.

FIGS. 5, 6 and 7 demonstrate the compliance of the solder leg about three orthogonal axes.

DETAILED DESCRIPTION OF THE PREFERRED EMBODIMENT

The surface mount socket 2 depicted in FIG. 1 comprises an insulating housing 4 having a plurality of terminals 6 deployed in two rows along oppositely facing sides of the housing. As shown in FIG. 2, the socket 2 is intended to interconnect a dual in-line circuit package 10 to conductors on a printed circuit board 8. Both the dual in-line package 10 and the printed circuit board 8 are of conventional construction, but the printed circuit board 8 employs surface mounting pads intended for use with surface mount electrical components rather than with through-hole components such as normally used with the conventional dual in-line package 10.

The socket housing 4 comprises a generally rectilinear member having an upper surface 48 and a lower surface 50 for the plurality of lead and terminal-receiving cavities 40 extending from the upper surface to the lower surface of the housing. The housing is formed of a conventional high temperature insulating material suitable for withstanding the temperatures encountered in a typical vapor phase reflow soldering operation. In the preferred embodiment the housing floor has two sides along which the rows of cavities 40 are positioned. These two sides are joined by a central rib or ladder 52 having a pedestal 54 extending from the lower surface thereof and beyond the lower surface 50 of the housing. Each of the terminal-receiving cavities comprises a rear wall 46 having side walls 46a and 46b extending outwardly therefrom. Each cavity is closed along the outer end and communicates with lower housing surface 50 by means of opening 39.

A rib 44 best seen in FIG. 1 extends along a portion of the side wall 46a of each cavity 40. A similar rib extends along the opposite side wall 46b and each rib defines a groove between the rib and the rear wall 46. Each lead-receiving cavity has a lead opening 38 along the upper surface 48 of the housing which is dimensioned for receiving one of the leads of a conventional dual in-line circuit package to permit entry of the leads into the lead or terminal-receiving cavities 40.

Each of the individual terminals 6 comprises a stamped and formed member which may be plated for electrical contact with the dual in-line package leads as well as for maintaining a good solder contact with the surface mounting pads on a printed circuit board. It should be understood that different portions of the contact terminal are plated with a different material depending upon the function of the terminal in that specific region. The contact terminals are fabricated from a blank of resilient spring metal, and a cantilever section 16 adjacent one end of the terminal has a radiused portion 14 comprising the area for establishing physical contact with an individual dual in-line package lead. The first end of the terminal between the free end and the radiused section 18 comprises the cantilever section 12. A second terminal section 20 located contiguous with the first cantilever section 12 extends axially along the lead-receiving cavity between the upper surface 48 and the lower surface 50. This axially extending second section 20 extends between radiused portion 18 and an angled portion 24. A pair of barbs 22 extend generally tranversely relative to the axially extending section 20 and extend inwardly toward the cantilever section 12. When the terminal 6 is inserted through opening 39 into the terminal-receiving cavity 40, the barbs 22 extend into the recess between the ledge 44 and the rear cavity wall 46. The pointed edges of the barbs 22 embed in the ribs 44 to firmly anchor the terminal along the first section 20. A third terminal section 26 extends from the angled portion 24 to the angled portion 28 and is contiguous with the second section of the terminal 20. The third terminal section 26 extends across opening 39 along the lower face 50 of the socket and when the socket is attached to the printed circuit board, the third terminal section 26 is parallel to the surface of the board. A fourth section of the terminal 30 extends perpendicular to the third section 26, with which it is contiguous. The fourth section 30 extends between angled section 28 and angled portion 32 and is perpendicular to the third terminal section and to the lower surface 50 of the housing. The fourth terminal section 30 is also perpendicular to the surface of a printed surface board when the socket 2 is mounted thereon. The final or the fifth terminal section 34 located at the opposite end of the terminal extends perpendicular to section 30 from the angled portion 32 to the end of the terminal and outwardly away from the side of housing 4.

The socket 2 can be positioned on a printed circuit board with the fifth terminal section 34 of each terminal in registry with a surface mount pad 62 located on the upper surface of printed circuit board 8. The pedestal 54 extending from the lower surface 50 of the socket can be adhesively mounted on the epoxy-glass fiber base 64 of the printed circuit board prior to soldering individual legs of the terminals to the solder mounting pads. It will be understood that in the preferred embodiment of this invention, solder paste is predeposited on the surface mounting pads 62 and a soldering operation such as vapor phase reflow soldering or infrared heating is employed to render the predeposited solder molten to form a solder fillet and a solder connection to the fifth terminal section 34. A lap joint is thus formed between each terminal 6 and its corresponding solder pad 62. This soldering operation can occur prior to insertion of a dual in-line package 10 having leads 72 extending from the main plastic body 70 into the socket 2. Thus the dual in-line package is not exposed to serious environmental conditions present during vapor phase reflow soldering.

When the leads 72 are inserted in lead-receiving cavities 40, the first cantilever section 12 of the terminals establishes mechanical contact with the individual leads 72. The integrity of the electrical connection between the leads 72 of the dual in-line packages and the conductors 60 depends upon the integrity of the mechanical connection formed along the cantilever section 12 of the terminal and the integrity of the solder joint formed between surface mounting pads 62 and the solder leg portion 34. The interconnection between the cantilever section 12 and the dual in-line package lead 72 is conventional in nature. However, the solder joint between the terminal and the surface mounting pads 62 is subject to significant stresses during thermal cycling, which occurs during normal usage. The different thermal coefficients of expansion of the housing material, the terminal, and the printed circuit board impart significant stresses which must be carried by the solder joint. The novel configuration of the terminal 6 forms a compliant member to reduce the stress placed upon the solder joint between leg 34 and the surface mounting pad 62. A portion of the axially extending terminal section 20 below the anchoring members 22 and the perpendicular terminal sections 26 and 30 forms a compliant section between two points respectively rigidly secured to the housing and to the printed circuit board, with the third terminal section 26 being just smaller than opening 39 to be free from interference therewith. The first of these rigidly secured points is formed by barbs 22 engaging the housing 4. The second rigidly secured point is the solder joint formed between the solder leg 34 and the surface mounting pad 62. FIGS. 5 through 7 illustrate the manner in which this compliant section can relieve the stresses about three orthogonal axes. In FIG. 5, stresses are relieved along the axis perpendicular to the printed circuit board. FIG. 6 shows that the terminal can deflect along a second orthogonal axis parallel to the surface of the printed circuit board. Finally, FIG. 7 illustrates that each terminal 6 is compliant in response to torsional stresses imposed upon an axis orthogonal to the axis depicted in FIGS. 5 and 6. This axis would extend perpendicular to a plane intersecting the solder leg 34 and the section 30. The significance of this compliant interconnection is amplified when it is recognized that similar connections must be formed between a plurality of terminals in each socket and the respective pads of the board. The relatively large stresses which can be developed in a multicontact socket of this type easily render each solder joint subject to damage, especially since the stresses can be magnified along the length of the housing. The individual compliant sections formed by each terminal permits these stresses to be relieved, without subjecting any individual solder joint in the socket to significant damage.

The socket comprising the preferred embodiment of this invention thus provides a sufficient multicontact connector permitting the use of through-hole devices such as dual in-line circuit elements on the printed boards suitable only for surface mounting. The invention is not limited to the specific embodiment as disclosed in the preferred embodiment since those skilled in the art could substitute equivalent elements without departing from the invention as disclosed herein. For example, the same compliant feature could be employed for dual leaf terminals, although the invention is described in terms of a single leaf terminal.

What is claimed is:

1. A multicontact surface mount dual in-line package socket for interconnecting a dual in-line circuit element package having a plurality of external leads, insertable into the socket, to the surface of a printed circuit board, to establish electrical and mechanical interconnection to surface mounting pads, having solder paste predeposited thereon, in a high temperature surface mount soldering operation, comprising:

a plastic insulative housing having a plurality of lead-receiving cavities arranged in two parallel rows and extending therethrough between an upper and a lower housing surface, each of said cavities communicating with said lower surface by a respective opening; and a plurality of stamped and formed terminals, disposed in respective said lead-receiving cavities each said terminal having:

a first flexible cantilever section adjacent a first end thereof and disposed within a said lead-receiving cavity, the first section comprising means for establishing electrical contact to an associated lead of a circuit element package, received into the lead-receiving cavity from said upper housing surface;

a second terminal section contiguous with the first terminal section extending axially within the lead-receiving cavity along an inner wall thereof, the second section having terminal retention elements thereon in engagement with the insulative housing and comprising means to anchor the terminal in the lead-receiving cavity;

a third terminal section contiguous with the second terminal section, the second terminal section being between the first terminal section and the third terminal section, the third terminal section extending across and within said lower surface cavity opening of said cavity perpendicular to the second terminal section and towards the outer side of the housing;

a fourth terminal section contiguous with the third terminal section, the third terminal section being between the second terminal section and the fourth terminal section, the fourth terminal section extending perpendicular to the third terminal section and extending below said lower housing surface; and a fifth terminal section adjacent the second end of the terminal and extending perpendicular to the fourth terminal section outwardly from said housing and spaced from said lower housing surface and parallel thereto, the fifth terminal section comprising means for establishing a solder connection to a corresponding surface mounting pad of a printed circuit board, each second terminal section being anchored to said insulative housing by said terminal retention elements and each fifth terminal section being fixed to said printed circuit board by a solder joint providing two rigidly secured points after the package socket is secured to said printed circuit board with each said third terminal section being slightly smaller than said lower surface cavity opening so as to be free of interference therewith, and that portion of each said terminal between said terminal retention elements and said fifth terminal section including each third and fourth section comprises a compliant member flexible along two orthogonal axes and flexible in torsion about a third orthogonal axis parallel to said rows, each terminal section being formed by bending said terminal about an axis parallel to the plane of the stamped terminal blank to form a more compliant member along the two orthogonal axes, whereby said terminals can move to absorb the differential expansion between said printed circuit board and said plastic insulative housing without disrupting the solder connections between the fifth terminal sections and the corresponding surface mounting pads.

2. The socket of claim 1 further comprising a pedestal extending from the lower surface of the insulative housing and comprising means for adhesively securing the insulative housing to the printed circuit board with the terminal fifth sections in registry with corresponding surface mounting pads.

3. The socket of claim 1 wherein the third and fourth terminal sections remain compliant during a vapor phase reflow surface mount soldering operation.

4. The socket of claim 3 wherein the terminals are tin plated.

5. The socket of claim 1 wherein the two rows of terminals are aligned to extend parallel to the third orthogonal axis.

6. The socket of claim 1 wherein the two orthogonal axes are perpendicular to the row of terminals, compliance about the third axis resulting from torsion in the third and fourth sections.

* * * * *